US008750438B2

(12) United States Patent
Gupta

(10) Patent No.: US 8,750,438 B2
(45) Date of Patent: Jun. 10, 2014

(54) INTERFERENCE RESISTANT COMPRESSIVE SAMPLING

(75) Inventor: Jai Gupta, Concord, MA (US)

(73) Assignee: NewLANS, Inc., Acton, MA (US)

( * ) Notice: Subject to any disclaimer, the term of this patent is extended or adjusted under 35 U.S.C. 154(b) by 0 days.

(21) Appl. No.: 13/491,892

(22) Filed: Jun. 8, 2012

(65) Prior Publication Data

US 2012/0314822 A1 Dec. 13, 2012

Related U.S. Application Data

(60) Provisional application No. 61/494,604, filed on Jun. 8, 2011.

(51) Int. Cl.
*H03D 1/04* (2006.01)
*H03D 1/06* (2006.01)
*H03K 5/01* (2006.01)
*H03K 6/04* (2006.01)
*H04B 1/10* (2006.01)
*H04L 1/00* (2006.01)
*H04L 25/08* (2006.01)

(52) U.S. Cl.
USPC ........................................................ 375/346

(58) Field of Classification Search
USPC ................................................ 375/148, 150
See application file for complete search history.

(56) References Cited

U.S. PATENT DOCUMENTS

| 6,791,964 | B1* | 9/2004 | Hwang et al. | 370/342 |
| 2005/0036539 | A1* | 2/2005 | Niederholz et al. | 375/150 |
| 2012/0016921 | A1* | 1/2012 | Davenport et al. | 708/322 |

FOREIGN PATENT DOCUMENTS

WO  WO 2010/108099 A1  9/2010

OTHER PUBLICATIONS

Notification of Transmittal of International Search and Written Opinion of theInternational Searching Authority of PCT/US2012/041587, date of mailing Jul. 31, 2012.
Matusiak, Ewa, et al., "Sub-Nyquist Sampling of Short Pulses: Theory," Apr. 2011, *IEEE* (15 pages).
Mangia, Mauro, et al., "Analog-to-Information Conversion of Sparse and non-White Signals: Statistical Design of Sensing Waveforms," 2011, *IEEE* (4 pages).
Chen, Xi, et al, "A Sub-Nyquist Rate Sampling Receiver Exploiting Compressive Sensing," 2010 *IEEE Transactions on Circuits and Systems—1: Regular Papers* (14 pages).
Bostamam, Anas Muhamad, et al., "Experimental Investigation of Undersampling for Adjacent Channel Interference Cancellation Scheme," *2005 IEEE 16th International Symposium on Personal, Indoor and Mobile Radio Communication* (5 pages).
E. Candes and M. Wakin, "An Introduction to Compressive Sampling," *IEEE Signal Processing Magazine*, pp. 21-30, Mar. 2008.
M.A. Davenport, S.R. Schnelle, J.P. Slavinsky, R.G. Baraniuk, M.B. Wakin, and P.T. Boufounos, "A Wideband Compressive Radio Receiver," *Military Communications Conference 2010*, pp. 1193-1198, Nov. 2010.

(Continued)

*Primary Examiner* — Chieh M Fan
*Assistant Examiner* — Wednel Cadeau
(74) *Attorney, Agent, or Firm* — Hamilton, Brook, Smith & Reynolds, P.C.

(57) ABSTRACT

Embodiments provide for dramatically improved interference resistance in advanced communications applications, where the frequency range can exceed 1 GHz. Such embodiments may be implemented using wideband technology to provide a wideband compressive sampling architecture that is capable of superior interference rejection through RF front end cancellation.

10 Claims, 4 Drawing Sheets

(56) References Cited

OTHER PUBLICATIONS

M.A. Davenport, P. Boufounos, R. Baraniuk, "Compressive Domain Interference Cancellation," *Workshop on Signal Processing with Adaptive Sparse Structured Representations*, Apr. 2009.

S. Hwang, S. Jong, D. Kim, and J. Seo, "An MMSE-based Compressive Domain Interference Cancellator for Wideband Systems," *2010 The 2nd International Conference on Computer and Automation Engineering*, pp. 359-362, Feb. 2010.

J. Ranieri, R. Rovatti, and G. Setti, "Compressive Sensing of Localized Signals: Application to Analog-to-Information Conversion," *Proceedings of the 2010 IEEE International Symposium on Circuits and Systems*, pp. 3513-3516, Jun. 2010.

Notification Concerning Transmittal of International Preliminary Report on Patentability of PCT/US2012/041587, "Interference Resistant Compressive Sampling," date mailed Dec. 27, 2013.

\* cited by examiner

INTERFERENCE RESISTANT COMPRESSIVE SAMPLING

RELATED APPLICATION

This application claims the benefit of U.S. Provisional Application No. 61/494,604, filed on Jun. 8, 2011.

The entire teachings of the above application are incorporated herein by reference.

BACKGROUND

Compressive sampling (CS) presents an intriguing new opportunity for wireless communication systems. A host of functions, including antenna array processing, multipath estimation, and interference rejection, are severely limited by the need to operate on large numbers of samples at high speed. Moreover, high analog/digital conversion (ADC) rates required for traditional sampling techniques are extremely power intensive, and are therefore prohibitive to many new applications, particularly at wide bandwidth. CS addresses these issues by enabling signal recovery from far fewer samples than traditional Nyquist sampling.

SUMMARY

Embodiments of the present invention provide for dramatically improved interference resistance in advanced communications applications, where the frequency range can exceed 1 GHz. Such embodiments may be implemented using wideband technology to provide a wideband compressive sampling architecture that is capable of superior interference rejection through RF front end cancellation.

Embodiments of the invention include a circuit for sampling a signal. The circuit may include an attenuator, a mixer, an integrator, and a sample-and-hold circuit. The attenuator may be configured to receive a chipping sequence and an attenuation value, the attenuator attenuating the chipping sequence based on the attenuation value to output a corresponding mixing sequence. The mixer receives a data signal, modulates the data signal according to the mixing sequence, and generates a modulated data signal. The integrator receives the modulated data signal and generates a filtered modulated data signal. The sample-and-hold circuit sample the filtered modulated data signal to provided a sampled data signal.

In further embodiments, the attenuator value may be generated to attenuate the chipping sequence such that the mixing sequence enables the mixer to cancel interference in the data signal. The attenuator value may generated based on information relating to one or more of a signal of interest contained within the data signal, anticipated noise within the data signal, and anticipated interference within the data signal. The chipping sequence is a random sequence or a predefined pattern.

Further embodiments of the invention may include a radio-frequency (RF) front-end circuit comprising a pre-sampling front-end circuit and a compressive sampling circuit as described above. The pre-sampling front-end circuit may be configured to receive an analog RF signal from an antenna and output a data signal. The front-end may also include a digital processor configured to process the sampled data signal. The digital processor may be further configured to perform one or more of signal energy detection, filtering the signal of interest, classification, and demodulation. The digital processor may operate under parameters that include the sampled data signal being absent of interference as a result of interference cancellation by the compressive sampling circuit.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

The teachings of all patents, published applications and references cited herein are incorporated by reference in their entirety.

Figure 1:
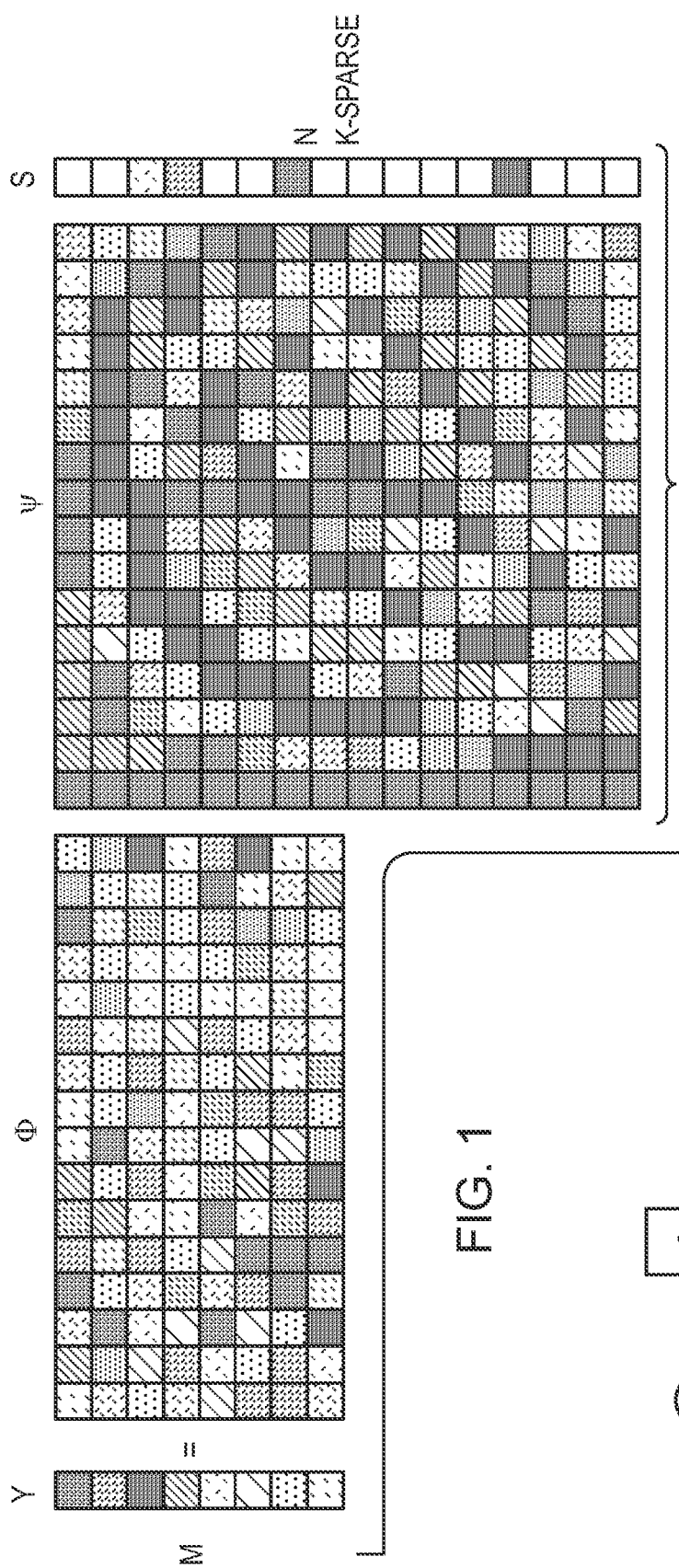
FIG. 1 illustrates compressive sensing measurement.

To better understand the problem area, a short description of the implications of signal basis information within CS theory is presented. Two key ideas underlie the compressive sampling paradigm: sparsity and incoherence [1]. Sparsity implies that the information rate of a continuous time signal can be much smaller than that suggested by its bandwidth, or that the number of degrees of freedom of a discrete signal can be much smaller than that suggested by its length. When expressed in the proper basis, the signal can be represented completely with a much smaller number of samples. Incoherence is the idea that a signal (x) that is sparse in a basis ($\Psi$) must be dense in its measurement basis ($\Phi$). An example is the relation between spikes (delta functions) and sinusoids. Mathematically, this corresponds to the physical process of sampling (measurement basis) a Fourier (representation basis) transformed signal. In general, compressive sampling is performed by taking M measurements of a length-N signal x (represented as $\Psi$s, where s is the sparsity vector and contains K non-zero entries) to form a measurement vector y. The signal x can then be reconstructed from y using an appropriate algorithm. The measurement process is illustrated in FIG. 1.

The problem of interference cancellation in compressive sensing systems is beginning to receive greater attention in the communications literature. In one very recent example, the authors of [2] have simulated a wideband compressive radio receiver which can acquire and track narrowband signals over wide bandwidth, canceling interference and isolating signals of interest. The authors of [3] have also examined the problem of interference in the compressive domain, demonstrating the benefits of cancellation prior to signal recovery. In both cases, the authors use a priori knowledge of basis support for the interfering signals to separate them from the target signal. Measurements are made by projecting into a space that is orthogonal to the interference space. The authors of [4] take a slightly different approach to the problem, using a minimum mean square error (MMSE) technique to improve SNR performance, assuming a priori statistical knowledge of interfering signals.

In embodiments of the present invention, interference is canceled much earlier in the processing chain than these prior attempts—by placing the interference cancellation in the RF front end of the CS receiver.

There are several approaches that can be taken in the design of the receiver's Analog to Information (A/I) conversion architecture. Candes and Wakin [1] present two such architectures. Their Non-Uniform Sampler digitizes the signal at randomly sampled time points. This can be used for compressive representation of signals with sparse frequency spectra (spikes and sines are incoherent). A second architecture is Random Modulation Preintegration (RMPI).

Figure 2:
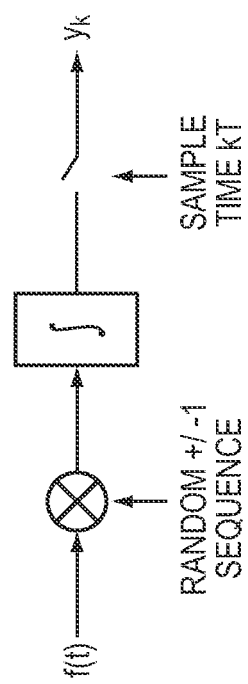
FIG. 2 illustrates RMPI sampling.

FIG. 2 is a block diagram illustrating RMPI sampling. Here, the signal is multiplied by a random sequence of ±1s, integrated over a time window, then sampled at the end of the time interval. A random antipodal sequence is a universal measurement process, and therefore it is incoherent with any time-frequency basis (such as the Gabor dictionary). The output measurements can then be used to reconstruct the original signal using an appropriate algorithm. RMPI is used for A/I conversion in [2]. Here, the random demodulator multiplies N Nyquist rate samples with a random ±1 sequence, generating M measurements by summing every N/M sequential coefficients. Therefore N=LM, where L is the ratio of the Nyquist rate to that of the low-rate ADC (sample-and-hold and accompanying quantizer) that follows integration.

Figures 3, 4:
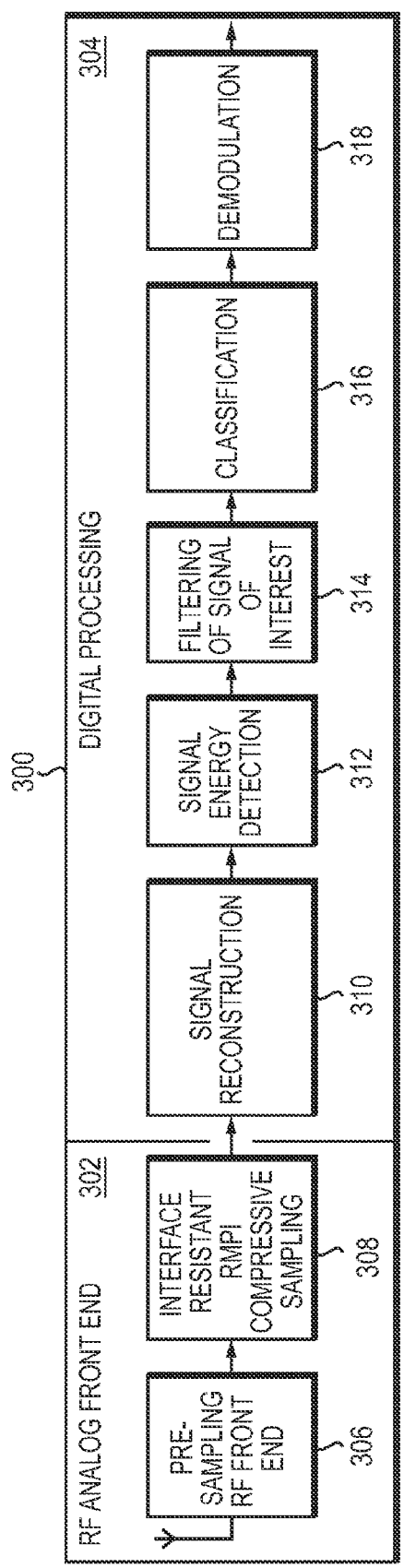
FIG. 3 is an operational block diagram of an example embodiment of a compressive sampling apparatus featuring interference-resistant compressive sampling.
FIG. 4 illustrates example $\Phi$IC formulation matrices.

FIG. 3 is an operational block diagram of an example embodiment of a compressive sampling apparatus 300. The apparatus 300 includes an RF analog front end 302 and digital signal processor 304. The RF analog front end 302 includes a pre-sampling circuit 306 and an interference-resistant compressive sampling circuit 308. The sampled signal may then be forwarded to digital signal processor 304, which may perform signal reconstruction 310, signal energy detection 312, filtering of the signal of interest 314, classification 316, and demodulation 318.

Embodiments of the wideband compressive sampler provide a measurement set that can deliver superior interference performance to previous CS techniques. By cancelling interference in the RF front end circuitry, it is unnecessary to rely on back end DSPs to perform the function, as is done in [2,3,4]. By this point, strong narrowband interference may have degraded the measurements of the collected samples to such a degree that it may not be possible to recover the original signal in practice. Embodiments of the present invention avoid this problem by introducing a new take on standard RMPI A/I conversion.

In example embodiments of the present invention, the RMPI method (described above with reference to FIG. 2) is modified by replacing random ±1 sequences with sequences that are capable of interference rejection. Recall that the antipodal random sequences used in RMPI are universally incoherent with any time-frequency basis [1]. While this allows extraordinary flexibility to measure signals of interest, it is also by definition non-resistant to interference across the entire time-frequency plane. Replacement of these sequences with sequences designed for interference cancellation offers the potential to create a measurement basis that is strongly incoherent with signals of interest yet weakly incoherent with interfering signals. The authors of [5] have also considered the problem of improving RMPI measurement through the introduction of chipping spectral profile as a further degree of freedom. They demonstrate significant reconstruction improvements when signals are localized in the frequency domain. Though no mention is made of interference cancellation, their investigation lends credence to the proposed solution.

A challenge lies in designing sequences that are resistant to interference using a priori knowledge of its geometry and/or statistics. As previously mentioned, using known basis support to create a projection matrix that nulls interference, as in [2,3], is subject to SNR difficulties when the target signal and interference signals are not sufficiently orthogonal, and we will initially focus on an MMSE-based approach as described in [4]. This method requires knowledge of the signal, interference, and noise covariance matrices. From these matrices, the authors derive an interference cancellation linear operator $P_{MMSE}=(\Phi C_S \Phi^*)(\Phi C_S \Phi^*+\Phi C_I \phi^*+\Phi C_W \Phi^*)^{-1}$ where $\Phi$ is the measurement basis and $C_S$, $C_I$, and $C_W$ are the signal, interference, and noise covariance matrices. Rather than applying this operator at the back end, as they do, embodiments of the present invention apply it up front by incorporating it into the measurement process.

The procedure is comparable to [2], in that the authors also use a linear operator to map samples of x to a set of measurements y. However, instead of using $\Phi$ as the operator as they do, embodiments of the present invention alter it using a priori covariance knowledge to create the operator $P_{MMSE}$. As in standard RMPI, the measurement basis can be a set of random antipodal sequences, now made interference resistant by applying the interference cancellation operator.

FIG. 4 illustrates example formulation matrices to create the $P_{MMSE}$ operator. Modulation of the incoming data signal is performed with these modified sequences. For notational simplification, the operator $P_{MMSE}$ will be termed $\Phi_{IC}$ to designate it as an interference cancelling measurement basis. Interference cancellation is therefore done in the RF front end as opposed to the back end, as in [2]. A second challenge is the design of a Nyquist rate modulator using relatively complex sequences. While ±1s are relatively simple to implement in hardware, generating high-precision values at high rates may to require a sophisticated attenuator and high speed serial interface. See [4] for a detailed description of formulation matrix construction.

Figure 5:
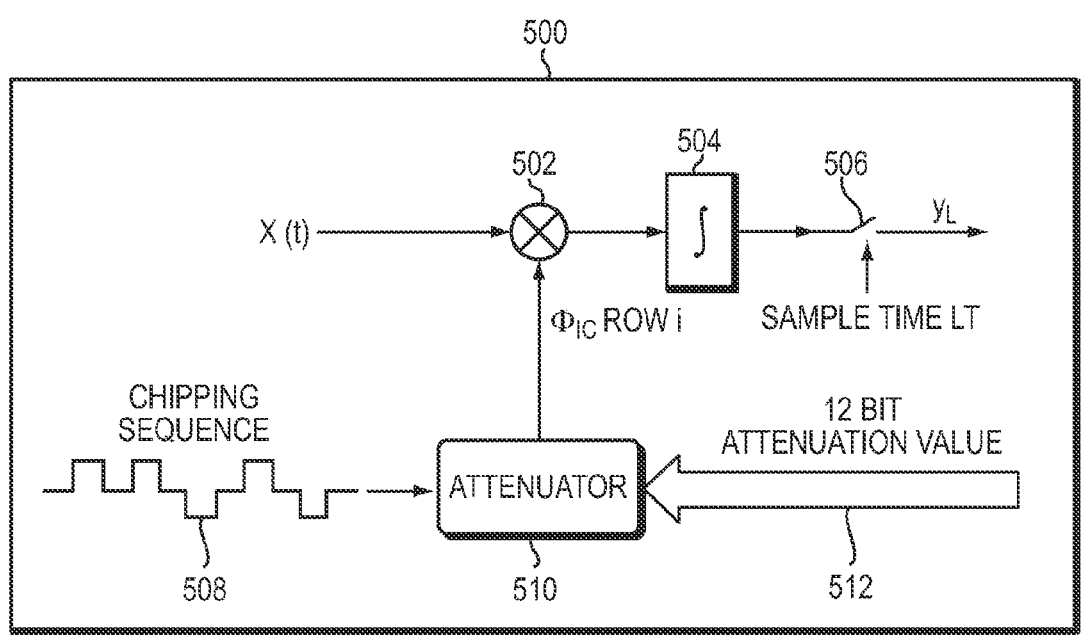
FIG. 5 illustrates an example interference resistant wideband compressive sampler.

FIG. 5 illustrates a wideband compressive sampler 500 in an example embodiment, which implements a mixer 502, integrator 504, and low-rate sample-and-hold circuit 506 consistent with RMPI. A binary, antipodal chipping sequence 508 is attenuated by an attenuator 510 such that the chipping sequence becomes a row sub-matrix of the measurement operator $\Phi_{IC}$. Attenuation values 512 corresponding to the $\Phi_{IC}$ rows are generated in a FPGA and passed to the attenuator through a high rate interface. The binary, antipodal chipping sequence is attenuated by an amount commensurate with these values. As a result, the chipping sequence is pseudo-random due to the incorporation of deterministic covariance information. In alternative embodiments, the chipping sequence may be a predefined pattern or other non-random sequence. The length-N signal x is modulated with the length-L chipping sequence then integrated over a window LT, where T is the Nyquist sample time. The signal is then sampled-and-held and passed to a quantizer, such as a sigma-delta ($\Sigma\Delta$) converter. The outputs from the compressive sampler are the M components of y (recall N=LM).

An appropriate algorithm is then used to reconstruct the signal x from the measurements y, given a representation basis $\Psi$. Due to cancellation during measurement, the reconstructed signal x is an interference and noise free digital version of the RF signal x(t). As an example, using $L_1$ minimization techniques, the number of required measurements is M≥cKlog(N/K) for high probability reconstruction of a K-sparse signal [4]. Alternatively, greedy algorithms such as orthogonal matching pursuit will be employed.

In some embodiments, the mixer, integrator and low-rate sample-and-hold circuits can be made in accordance with teachings of International Patent Application No. PCT/US2011/024542 entitled "Broadband Analog Radio-Frequency Components," the teachings of which are incorporated herein by reference in their entirety.

Performance of the compressive sampler shown in FIG. 5 may be measured to determine the efficacy of the interference cancellation. A key performance metric, which can be measured following compressive measurement and before quantization, is SNR vs. $K_I/K_S$ for a given SIR, where SNR is the signal to noise ratio, $K_I/K_S$ is the sparsity ratio of the interference to the signal of interest, and SIR is the signal to interference ratio. A goal value may be ≥72 dB for all $K_I/K_S$ over the expected SIR range. Due to the need to satisfy noise figure and dynamic range requirements, the number of measurements may be greater than the minimum required for reconstruction, and the restricted isometry property [5] must be satisfied to sufficient degree to ensure desired performance levels. A noise figure of 12 dB would be in line with other compressive sensing acquisition receivers, while a 72 dB dynamic range will present enough SNR to achieve 12-bit resolution from the analog to digital converter.

An appropriate algorithm may be selected to reconstruct the signal. There are two major classes of algorithms that are used for the purpose of compressive sampling signal reconstruction, though other algorithms also may be used. One class comprises algorithms that minimize the L1-norm. One example is the Lasso algorithm. The other class comprises greedy algorithms. These form a fast, approximate representation by taking successively highest correlation values (such as through an inner product) of the measured signal with a dictionary set. An example is matching pursuit, or orthogonal matching pursuit.

Figure 6:
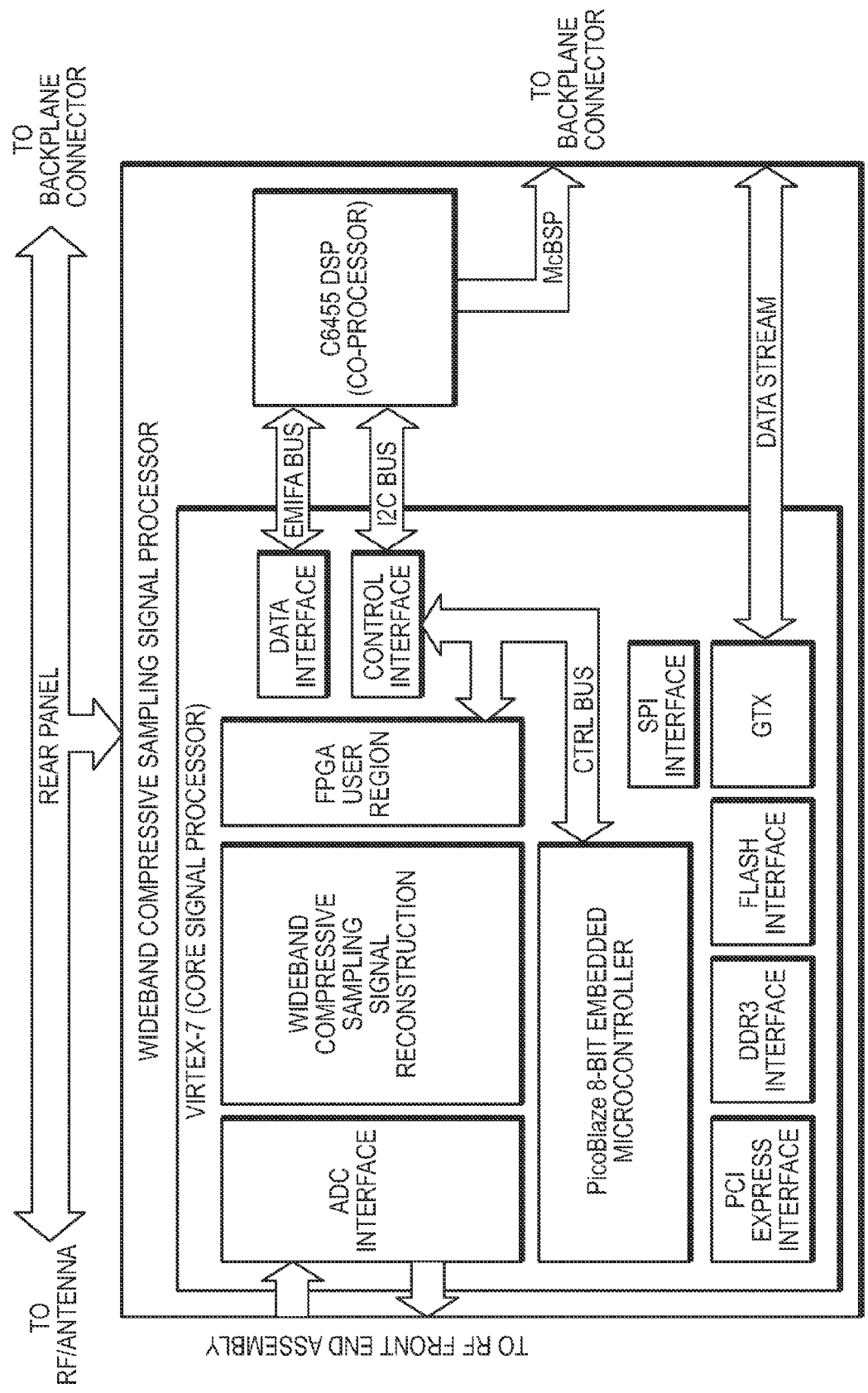
FIG. 6 illustrates an embodiment in which an interference resistant wideband compressive sampler interfaces a back-end field-programmable gate array (FPGA) and digital signal processor (DSP).

FIG. 6 shows an embodiment in which an interference resistant wideband compressive sampler interfaces a back-end FPGA and DSP, where the signal reconstruction algorithms and other digital processing as shown in FIG. 3 are performed. As shown, the interference resistant wideband compressive sampler's sample-and-hold circuit interfaces an ADC (such as a delta-sigma converter), which interfaces the FPGA/DSP back-end. Signal reconstruction may be performed using a Programmable System on Chip (PSoC) such as Cypress Semiconductor's CY8C55 as shown in FIG. 6. Successive digital processing tasks, such as energy detection, filtering, classification, and demodulation, as referenced earlier, may be performed using FPGAs and/or DSPs. These tasks can be done through conventional means, although the digital processor may omit interference cancellation as described above with reference to FIG. 3. With the omission of digital interference cancellation, the digital processor may operate under parameters that include the sampled data signal input being absent of interference as a result of interference cancellation by the compressive sampling circuit. In alternative embodiments, the digital processor may implement a redundant or supplemental interference cancellation to further enhance performance.

REFERENCES

[1] E. Candes and M. Wakin, "An Introduction to Compressive Sampling," *IEEE Signal Processing Magazine*, pp. 21-30, March 2008.

[2] M. A. Davenport, S. R. Schnelle, J. P. Slavinsky, R. G. Baraniuk, M. B. Wakin, and P. T. Boufounos, "A Wideband Compressive Radio Receiver," *Military Communications Conference* 2010, pp. 1193-1198, November 2010.

[3] M. A. Davenport, P. Boufounos, R. Baraniuk, "Compressive Domain Interference Cancellation," *Workshop on Signal Processing with Adaptive Sparse Structured Representations*, April 2009.

[4] S. Hwang, S. Jang, D. Kim, and J. Seo, "An MMSE-based Compressive Domain Interference Cancellator for Wideband Systems," 2010 *The 2nd International Conference on Computer and Automation Engineering*, pp. 359-362, February 2010.

[5] J. Ranieri, R. Rovatti, and G. Setti, "Compressive Sensing of Localized Signals: Application to Analog-to-Information Conversion," *Proceedings of the 2010 IEEE International Symposium on Circuits and Systems*, pp. 3513-3516, June 2010.

While this invention has been particularly shown and described with references to example embodiments thereof, it will be understood by those skilled in the art that various changes in form and details may be made therein without departing from the scope of the invention encompassed by the appended claims.

What is claimed is:

1. A circuit for sampling a signal comprising:
an attenuator configured to receive a chipping sequence and an attenuation value, the attenuator attenuating the chipping sequence based on the attenuation value to output a corresponding mixing sequence;
a mixer configured to receive a data signal and modulate the data signal according to the mixing sequence, the mixer generating a modulated data signal;
an integrator configured to receive the modulated data signal and generate a filtered modulated data signal; and
a sample-and-hold circuit configured to sample the filtered modulated data signal;
wherein the attenuator value is generated to attenuate the chipping sequence such that the mixing sequence enables the mixer to cancel interference in the data signal at the analog front end, before analog to digital conversion has incorporated interfering signal power into the signal of interest; and
wherein the attenuator value is generated based on information relating to one or more of a signal of interest contained within the data signal, anticipated noise within the data signal, and anticipated interference within the data signal to compose a compressive measurement operator that is consistent with compressive sampling theory of operation.

2. The circuit of claim 1, wherein the chipping sequence is a random sequence.

3. The circuit of claim 1, wherein the chipping sequence is a predefined pattern.

4. A radio-frequency (RF) front-end circuit comprising:
a pre-sampling front-end circuit configured to receive an analog RF signal from an antenna and output a data signal; and
a compressive sampling circuit configured to sample the data signal, the compressive sampling circuit comprising:
an attenuator configured to receive a chipping sequence and an attenuation value, the attenuator attenuating the chipping sequence based on the attenuation value to output a corresponding mixing sequence;

a mixer configured to receive a data signal and modulate the data signal according to the mixing sequence, the mixer generating a modulated data signal;

an integrator configured to receive the modulated data signal and generate a filtered modulated data signal; and a sample-and-hold circuit configured to sample the filtered modulated data signal to generate a sampled data signal;

wherein the attenuator value is generated to attenuate the chipping sequence such that the mixing sequence enables the mixer to cancel interference in the data signal at the analog front end, before analog to digital conversion has incorporated interfering signal power into the signal of interest; and wherein the attenuator value is generated based on information relating to one or more of a signal of interest contained within the data signal, anticipated noise within the data signal, and anticipated interference within the data signal to compose a compressive measurement operator that is consistent with compressive sampling theory of operation.

5. The circuit of claim 4, further comprising a digital processor configured to process the sampled data signal.

6. The circuit of claim 5, wherein the digital processor is further configured to perform one or more of signal energy detection, filtering the signal of interest, classification, and demodulation.

7. The circuit of claim 5, wherein the digital processor operates under parameters including the sampled data signal being absent of interference as a result of interference cancellation by the compressive sampling circuit.

8. A method of compressive sampling comprising:
receiving a chipping sequence and an attenuation value;
attenuating the chipping sequence based on the attenuation value to output a corresponding mixing sequence;
modulating the data signal according to the mixing sequence to generate a modulated data signal;
generating a filtered modulated data signal via an integrator; and
sampling the filtered modulated data signal;
wherein attenuating the chipping sequence provides for cancelling interference in the data signal at the analog front end, before analog to digital conversion has incorporated interfering signal power into the signal of interest; and
wherein attenuating the chipping sequence is based on information relating to one or more of a signal of interest contained within the data signal, anticipated noise within the data signal, and anticipated interference within the data signal to compose a compressive measurement operator that is consistent with compressive sampling theory of operation.

9. The method of claim 8, wherein the chipping sequence is a random sequence.

10. The method of claim 8, wherein the chipping sequence is a predefined pattern.

* * * * *